United States Patent
Cassese et al.

[19]

[11] Patent Number: 5,949,191
[45] Date of Patent: *Sep. 7, 1999

[54] HEAT DISSIPATING TRANSFORMER IN A POWER SUPPLY CIRCUIT FOR A MOTOR VEHICLE HEADLIGHT

[75] Inventors: Bruno Cassese, Creteil; Patrick Wacheux, Villejuif; Gilles Paul, Fontenay-aux-Roses; Eric Herzberger, Gagny; Jean-Marc Nicolai, Courbevoie, all of France

[73] Assignee: Valeo Electronique, Creteil, France

[ * ] Notice: This patent issued on a continued prosecution application filed under 37 CFR 1.53(d), and is subject to the twenty year patent term provisions of 35 U.S.C. 154(a)(2).

[21] Appl. No.: 08/623,139

[22] Filed: Mar. 28, 1996

[30] Foreign Application Priority Data

Mar. 29, 1995 [FR] France ..................... 95 03718

[51] Int. Cl.$^6$ ..................................... H05B 37/02
[52] U.S. Cl. .............................. 315/82; 315/276; 336/200
[58] Field of Search ............................. 336/200; 315/82, 315/276

[56] References Cited

U.S. PATENT DOCUMENTS

| | | | |
|---|---|---|---|
| 3,833,838 | 9/1974 | Christiansen | 336/200 |
| 4,249,229 | 2/1981 | Hester | 336/200 |
| 4,873,757 | 10/1989 | Williams | 29/602.1 |
| 5,151,631 | 9/1992 | Oda et al. | 315/82 |
| 5,210,513 | 5/1993 | Khan et al. | 336/65 |
| 5,521,573 | 5/1996 | Inoh et al. | 336/200 |
| 5,652,561 | 7/1997 | Inoh et al. | 336/200 |

FOREIGN PATENT DOCUMENTS 0 507 360 A2  10/1992  European Pat. Off. .
2 252 208      7/1992  United Kingdom .

*Primary Examiner*—Michael B. Shingleton
*Attorney, Agent, or Firm*—McCormick, Paulding & Huber

[57] ABSTRACT

An assembly, in particular for the power supply circuit of a discharge lamp in a motor vehicle headlight, the assembly comprising a wound transformer together with a printed circuit on which said transformer is mounted, wherein said printed circuit is mounted on a metal soleplate forming a heat sink and wherein the ferrite element(s) of the transformer is (are) in thermal contact through its (their) whole surface directly facing the metal soleplate, with the printed circuit or with the metal soleplate.

7 Claims, 6 Drawing Sheets

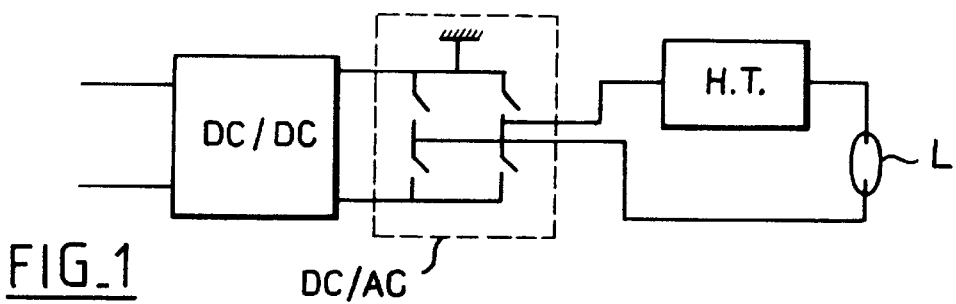
FIG_1
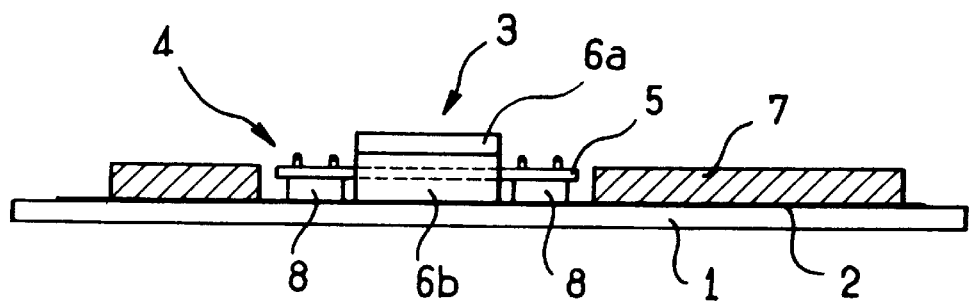
FIG_2
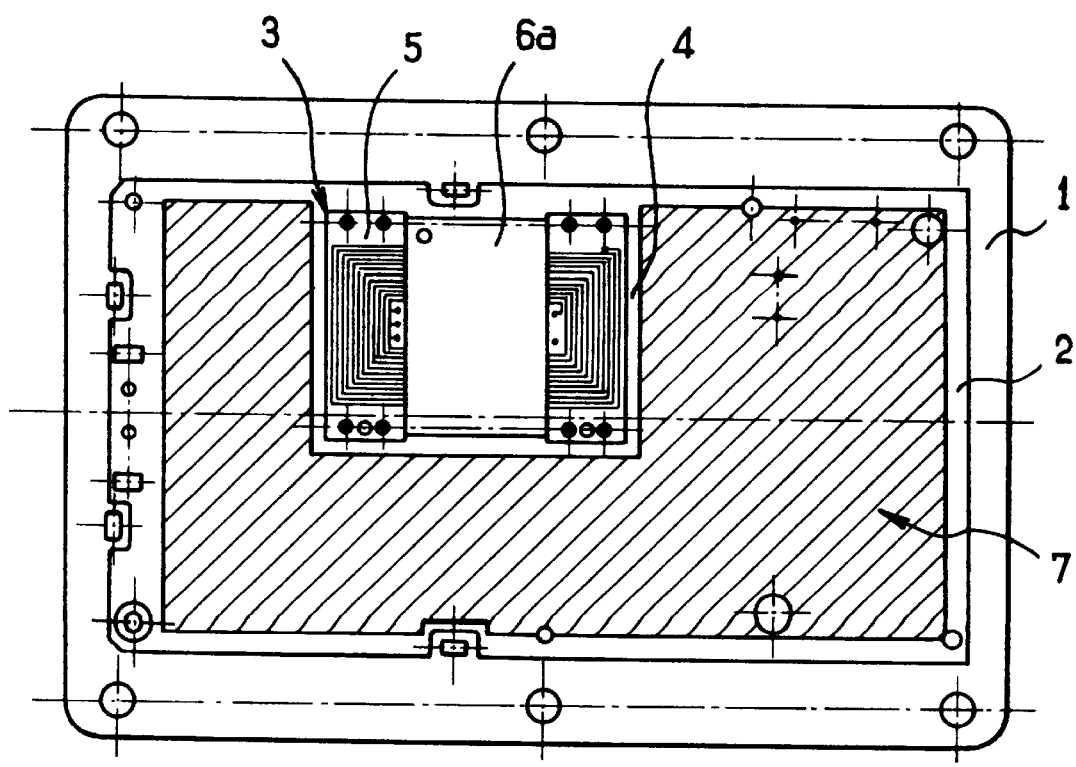
FIG_3

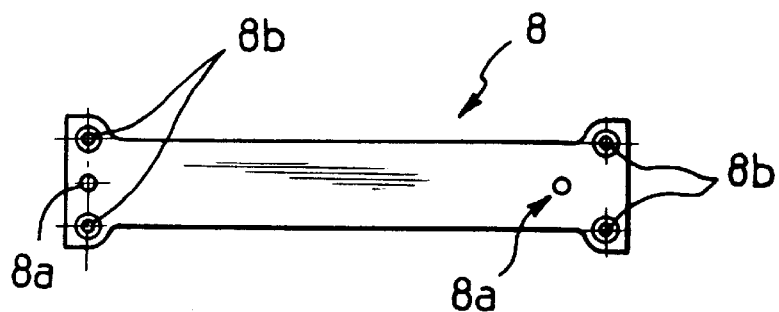
FIG_4a
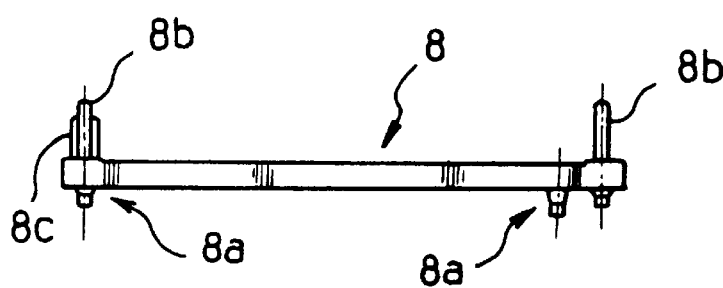
FIG_4b
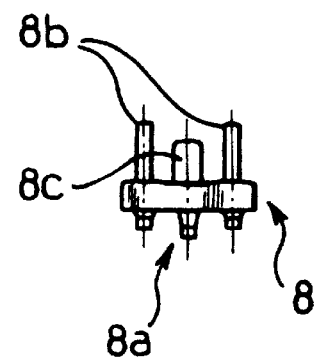
FIG_4c
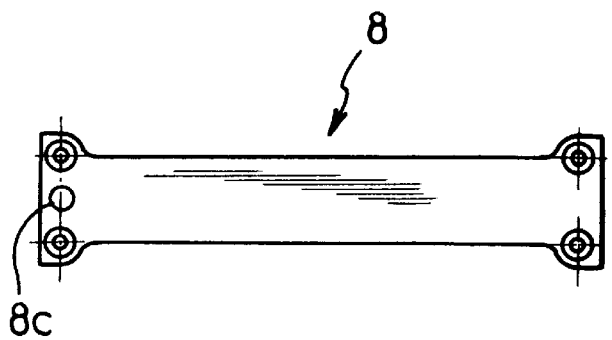
FIG_4d

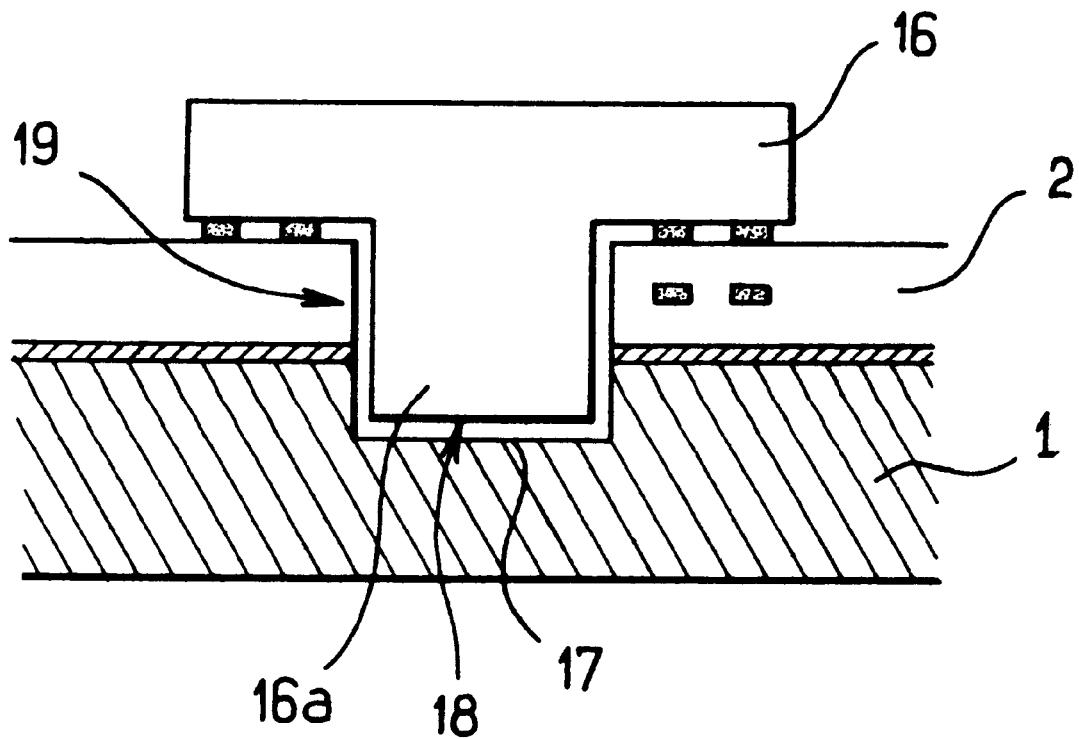
FIG_6

HEAT DISSIPATING TRANSFORMER IN A POWER SUPPLY CIRCUIT FOR A MOTOR VEHICLE HEADLIGHT

The present invention relates to a transformer assembly, in particular for the power supply circuit of a motor vehicle discharge lamp.

BACKGROUND OF THE INVENTION

FIG. 1 is a diagram of the power supply circuit for a conventional discharge lamp. The discharge lamp, given reference L, is connected in series with a high voltage module HT for generating a high voltage trigger pulse, and it is voltage triggered by a DC/AC converter (constituted by a DC/AC H-bridge) downstream from a DC/DC converter including a transformer and receiving as its input the (12 V) voltage provided by the vehicle battery B.

The DC/DC converter generates all of the voltages required other than that of the trigger pulse. In particular, it must be capable of providing a high voltage of 500 V for several milliseconds for starting purposes.

The transformers that have been used up to now in such DC/DC converters powering the discharge lamps of motor vehicle headlights have therefore been relatively bulky.

Unfortunately, it is presently desired to reduce the bulk of discharge lamp power supply circuits so as to enable them to be housed completely within headlights, whereas until now the converters of such power supply circuits have been outside the corresponding headlights.

U.S. Pat. No. 4,873,757 discloses transformers of small dimensions in which the windings are constituted by a multilayer printed circuit and in which the ferrites are constituted by a pair of E-shaped ferrites that are closed one on the other with their branches passing through openings in the multilayer circuit.

The ferrites and the multilayer circuit are applied to a printed circuit. To this end, the ferrites are held in metal banding which surrounds them in part and which is bonded at two points to the printed circuit. The metal banding serves to ground the ferrites.

Such a transformer is not always satisfactory.

In particular, the ferrites tend to heat up considerably, thereby making that type of transformer incompatible with certain applications.

OBJECTS AND SUMMARY OF THE INVENTION

The invention proposes a structure enabling those drawbacks to be mitigated.

More particularly, the invention provides an assembly, in particular for the power supply circuit of a discharge lamp in a motor vehicle headlight, the assembly comprising a wound transformer together with a printed circuit on which said transformer is mounted, wherein said printed circuit is mounted on a metal soleplate forming a heat sink and wherein the ferrite element(s) of the transformer is (are) in thermal contact through its (their) whole surface directly facing the metal soleplate, with the printed circuit or with the metal soleplate.

As will readily be understood, such an assembly is an easy mounting which serves both to dissipate heat from the ferrite element(s) and to ground said element(s).

Advantageously, an intermediate layer is disposed between the whole of said surface and the printed circuit or metal soleplate.

The invention also provides a motor vehicle discharge lamp power supply circuit including such a transformer.

The invention also provides a motor vehicle discharge lamp headlight including such a power supply circuit.

BRIEF DESCRIPTION OF THE DRAWINGS

Other characteristics and advantages of the invention appear further from the following description. The description is purely illustrative and non-limiting. It should be read with reference to the accompanying drawings, in which:

FIG. 1, described above, is a block diagram of a motor vehicle discharge lamp power supply circuit;

FIG. 2 is a section view of a circuit constituting one possible embodiment of the invention;

FIG. 3 is a plan view of the FIG. 2 circuit;

FIGS. 4a to 4d are a view from above, a side view, an end view, and a view from below of bars for fixing the transformer of the assembly of FIGS. 2 and 3 on the printed circuit card;

MORE DETAILED DESCRIPTION

Figure 5A:
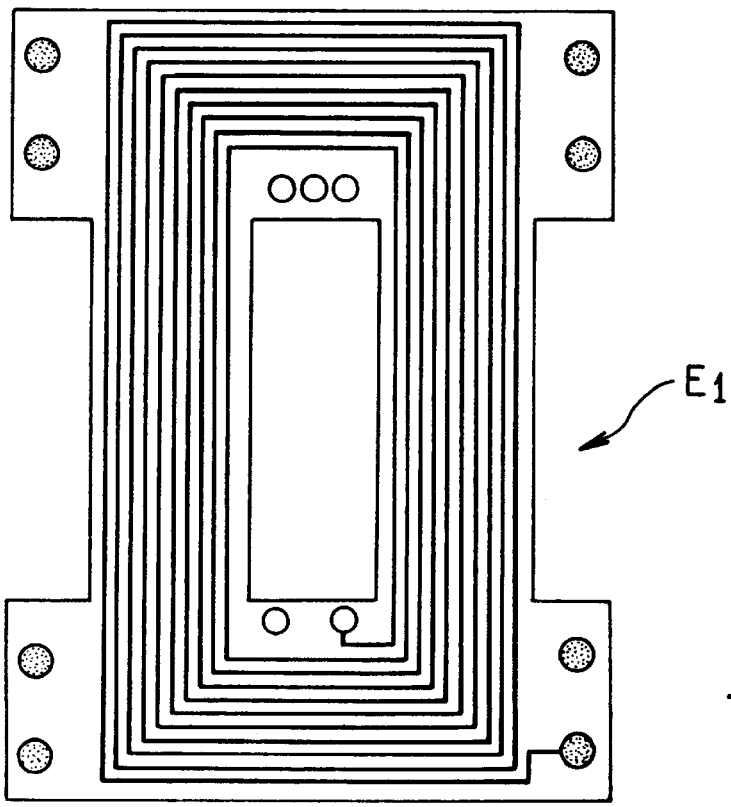
FIGS. 5a to 5f are plan views of each of the various windings of the multilayer transformer structure of FIGS. 2 and 3.
Figure 5B:
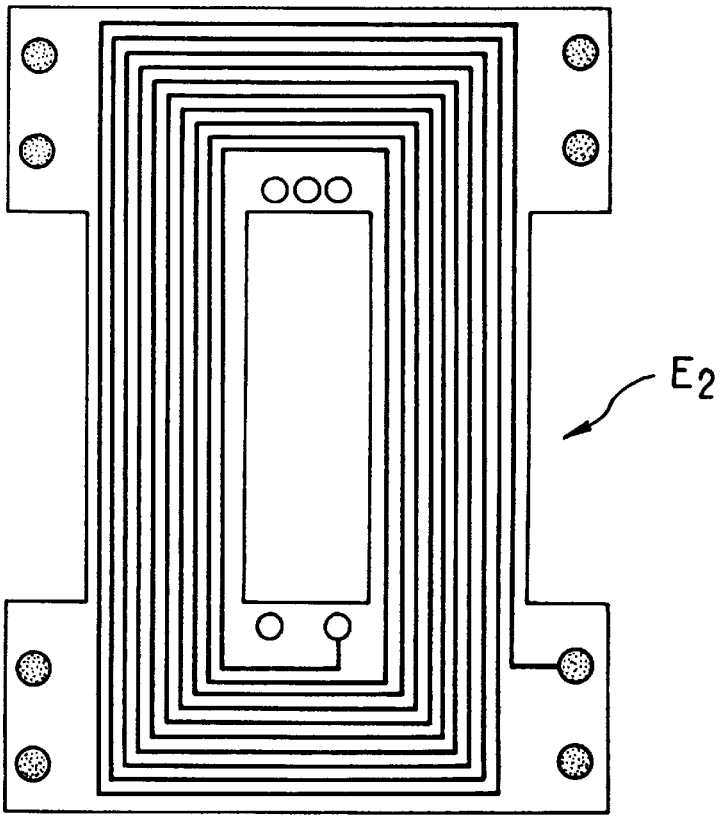

The assembly shown in FIGS. 2 and 3 has a metal soleplate 1 e.g. made of aluminum, that forms a heat sink that carries a printed circuit card 2 on which is mounted a transformer 3.

The heat sink 1 and card 2 are substantially rectangular. Card 2 is a double-sided printed circuit hot-pressed on heat sink 1. It carries for example on its face opposite heat sink 1 CMS components disposed in an area 7 which surrounders transformer 3.

The transformer 3 is mainly constituted by a multilayer printed circuit 5 and two ferrite elements 6a and 6b that are closed one on the other. The element referenced 6a which is furthest from the heat sink 1 is flat in shape. The other element, referenced 6b, is E-shaped, its back being in contact, by all its surface, preferably via an adhesive, with printed circuit 2, while its branches pass through the multilayer card 5.

Therefore, printed circuit 2 provides electrical and thermal conduction of the ferrites 6a, 6b with the heat sink 1.

By way of example, the intermediate layer 7 may be a double-sided adhesive material or a glue film.

The multilayer card 5 is fixed on said printed circuit card 2 by means of two bars 8 of the kind shown more particularly in FIGS. 4a to 4d.

Each bar 8 is in the form of a flat strip carrying at each end one or more positioning pegs 8a extending toward the metal soleplate 1, and also electrical contact pins 8b extending towards the multilayer circuit 5. Each bar also carries one or more pegs 8c for positioning the multilayer circuit 5.

The bars 8 are, for example, wave soldered on printed circuit 2.

During the building up, transformer 3 is disposed on a copper zone of circuit 2, multilayer circuit 5 being disposed on bars 8. The adhesive layer also permits to maintain transformer 3 on circuit 2 before the soldering of multilayer circuit 5 on pins 8b, this operation being manually carried out.

FIGS. 5a to 5f show the windings of the various stacked layers of the multilayer card.

The top two windings $E_1$ and $E_2$ define a first secondary winding of the transformer (FIG. 5a).

Figure 5C:
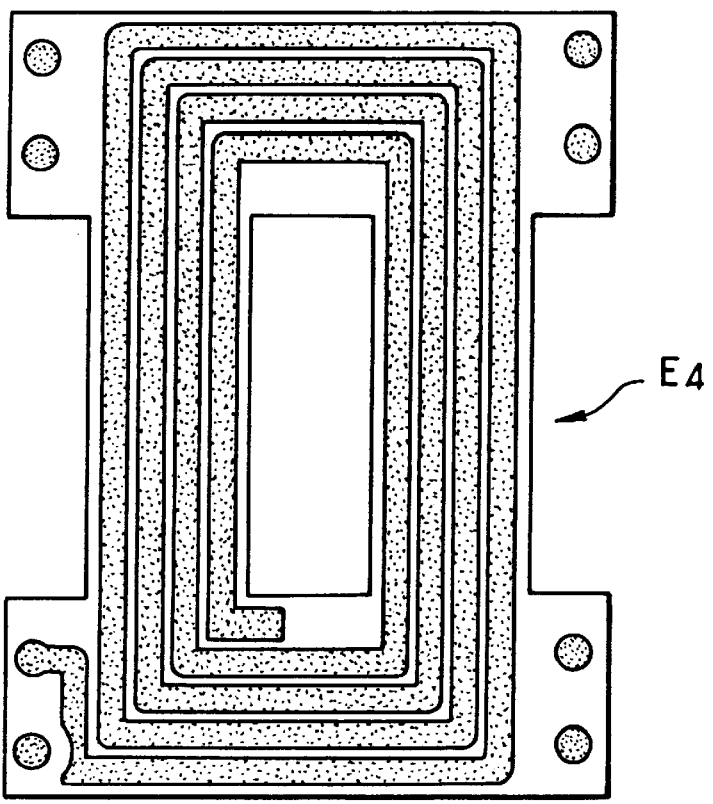
Figure 5D:
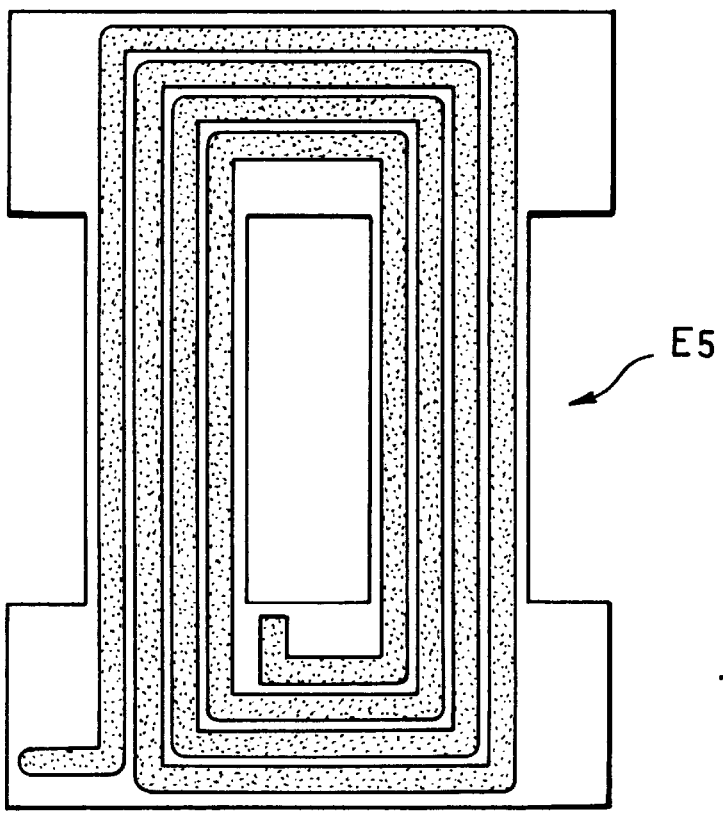
Figure 5E:
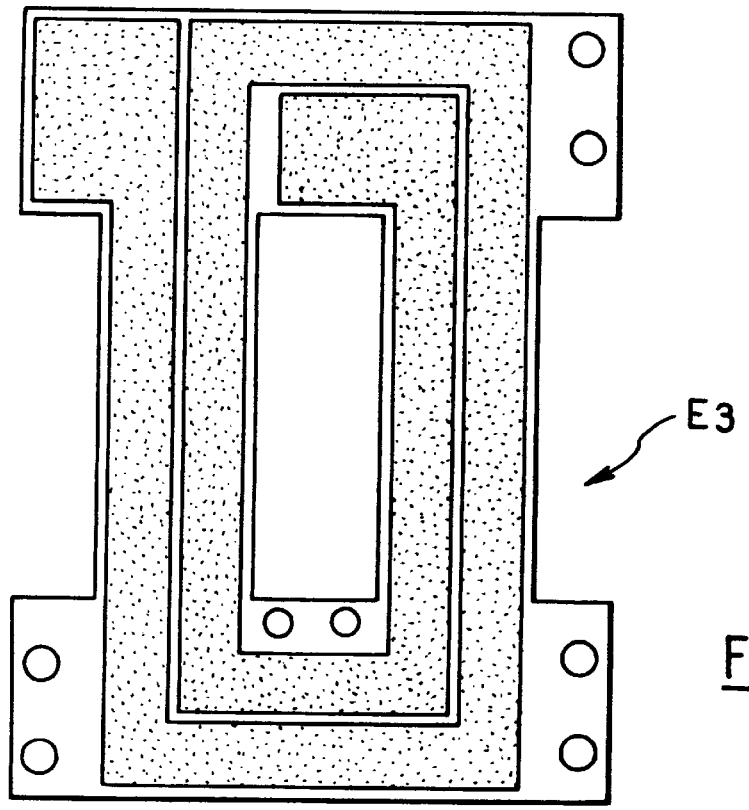
Figure 5F:
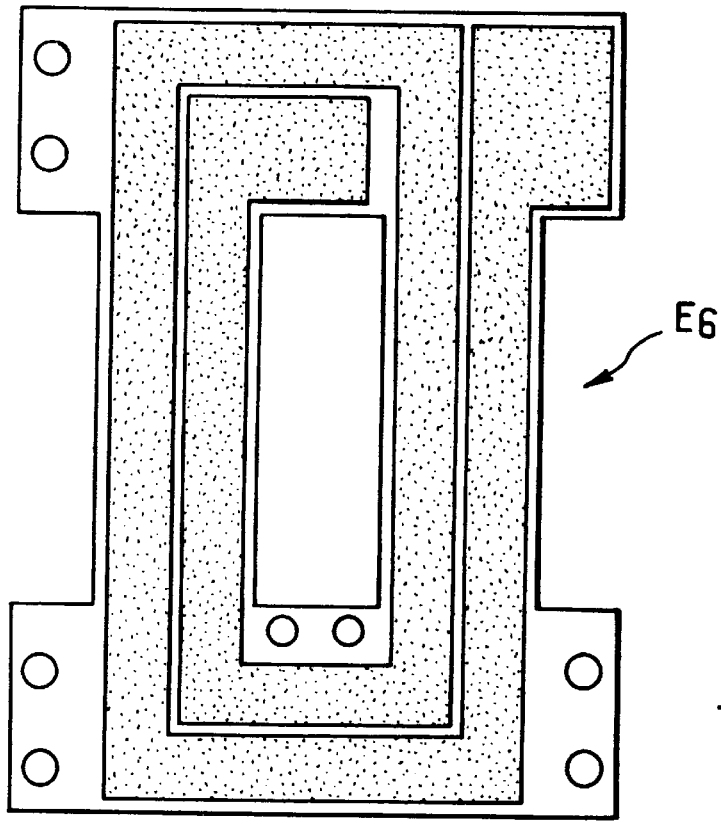

The following winding $E_3$ corresponds to one of the two primary windings of the transformer (FIG. 5e).

The following two windings $E_4$ and $E_5$ define a second secondary winding of the transformer (FIGS. 5c and 5d).

The bottom winding $E_6$ (FIG. 5f) corresponds to the second winding co-operating with the winding $E_3$ to define the primary of the transformer.

As can be seen in FIGS. 5a to 5f, each of the windings $E_1$ and $E_2$ has ten turns, such that the first secondary winding of the transformer has a total of twenty turns.

Each of the two windings $E_4$ and $E_5$ has four turns, such that the second secondary winding of the transformer has a total of eight turns.

Each of the two windings $E_3$ and $E_6$ has two turns, such that the total number of turns in the primary winding is four.

By way of example, the ferrites used are of the type sold by MAGNETICS under the references 43208EC and 43208EQJ.

Using such ferrites, the height of the transformer is about 10 mm.

We claim:

1. An assembly, in particular for the power supply circuit of a discharge lamp in a motor vehicle headlight, the assembly comprising a wound transformer together with a printed circuit on which said transformer is mounted, wherein said printed circuit is mounted on a metal soleplate forming a heat sink and wherein the ferrite element(s) of the transformer has a front surface, a back surface and at least one end surface defined as all exterior surfaces extending between the front and back surfaces, the back surface having a higher surface area relative to any one of the at least one end surface, the ferrite element(s) being in thermal contact through its (their) whole back surface with the printed circuit.

2. An assembly according to claim 1, wherein an intermediate layer is disposed between the whole of said surface and the printed circuit or metal soleplate.

3. An assembly according to claim 2, wherein the intermediate layer is a double-sided adhesive material.

4. An assembly according to claim 1, wherein the metal soleplate is made of aluminum.

5. An assembly, in particular for the power supply circuit of a discharge lamp in a motor vehicle headlight, the assembly comprising a wound transformer together with a printed circuit on which said transformer is mounted, wherein said circuit is mounted on a metal soleplate forming a heat sink and wherein the transformer is comprised of two ferrite elements that are closed one on the other, one of these ferrite elements being a flat shaped element, the other ferrite element being an E shaped element having a front surface, a back surface, and at least one end surface defined as all exterior surfaces between the front and back surfaces, the back surface having a higher surface area relative to any one of the at least one end surface, the E-shaped element being in contact throughout its back surface with the printed circuit.

6. A motor vehicle discharge lamp power supply circuit, including an assembly according to claim 1.

7. A motor vehicle discharge lamp headlight, including a power supply circuit according to claim 6.

* * * * *